United States Patent [19]

Lipp

[11] Patent Number: 5,309,090
[45] Date of Patent: May 3, 1994

[54] APPARATUS FOR HEATING AND CONTROLLING TEMPERATURE IN AN INTEGRATED CIRCUIT CHIP

[76] Inventor: Robert J. Lipp, 15881 Rose Ave., Los Gatos, Calif. 95030

[21] Appl. No.: 579,770

[22] Filed: Sep. 6, 1990

[51] Int. Cl.⁵ ............................................ G01R 31/28
[52] U.S. Cl. ........................ 324/158 R; 324/158 T; 219/209
[58] Field of Search .......... 324/158 R, 158 D, 158 T; 219/209, 210

[56] References Cited

U.S. PATENT DOCUMENTS

| | | | |
|---|---|---|---|
| 3,235,803 | 2/1966 | Imai et al. | 324/158 R |
| 3,659,199 | 4/1972 | Knutson | 324/158 D |
| 4,114,096 | 9/1978 | Chinery | 324/158 D |
| 4,165,642 | 8/1979 | Lipp | 73/362 SC |
| 4,497,998 | 2/1985 | West | 219/210 |
| 4,593,208 | 6/1986 | Single | 307/296 R |
| 4,661,771 | 4/1987 | Nakamura | 324/158 D |
| 4,768,170 | 8/1988 | Hoff | 365/212 |

Primary Examiner—Ernest F. Karlsen
Attorney, Agent, or Firm—Skjerven, Morrill, MacPherson, Franklin & Friel

[57] ABSTRACT

A method and an apparatus to heat an integrated circuit and regulate its temperature for the purposes of burn-in and temperature testing are provided. The circuit is heated internally by integrating a heating means. Sensing and controlling means may also be integrated. Such heating and controlling are activated by external signals applied to the IC. Practical means to heat the integrated circuit with pre-existing components is provided.

4 Claims, 2 Drawing Sheets

APPARATUS FOR HEATING AND CONTROLLING TEMPERATURE IN AN INTEGRATED CIRCUIT CHIP

FIELD OF THE INVENTION

This invention relates to the testing of integrated circuits and, in particular, to the testing of integrated circuits under elevated temperature or "burn-in" condition.

BACKGROUND OF THE INVENTION

Integrated circuits (ICs) are subject to a variety of failure modes due to improper manufacturing. Some of these failures occur only when the IC is operated at high temperature. Some failures occur only after the IC has been operated for some period of time which is substantially less than the predicted lifetime of the device. These latter failures are called "infant failures". Because operating the IC at high temperature for a short period of time accelerates infant failures, such condition may be used to screen for infant failures so they may be identified and discarded before the IC is deployed in actual use in a system.

To detect high-temperature failures, ICs are individually tested in special temperature chambers which raise each IC to the prescribed temperature. However, some ICs do not exhibit temperature operational problems until they are put into systems. It is often impractical to control the temperature of the IC in a system environment to see if it is defective at high temperature. It would be advantageous to be able to control its temperature under external command and without the need to place it in a special temperature controlled chamber.

Infant failures are commonly screened by a process called "burn-in". In this process, many ICs are loaded onto special burn-in boards which are placed into special temperature regulated burn-in ovens. They are then operated at a predetermined temperature for a period of time, which is often one week or more. In some cases they are life-tested, that is, they are subject to burn-in for 1000 hours or more. Burn-in and life-testing are expensive processes because of the equipment cost and because of the time the equipment is required to be dedicated to a relatively small number of ICs.

Temperature sensing and control means are not uncommon in ICs. Many methods are known to sense the temperature of an IC and generate a control signal. However, none of these circuits have been employed for reliability or burn-in purposes. Internal heating and regulating the temperature of an IC for high temperature or reliability testing is a novel idea. For example, in U.S. Pat. No. 4,165,642 entitled "MONOLITHIC CMOS DIGITAL TEMPERATURE MEASUREMENT CIRCUIT", by Robert J. Lipp, the temperature is sensed by measuring the voltage across a base-emitter junction and comparing that to a reference voltage generated by a band gap reference circuit. A digital control output is generated. Nothing is mentioned regarding heating and temperature sensing for burn-in or reliability testing. U.S. Pat. No. 4,497,998 entitled "TEMPERATURE STABILIZED STOP-RESTART OSCILLATOR" by Burnell G. West, has heating, sensing and controlling means for regulating the temperature of an IC. This apparatus is used to control the temperature for stabilizing an oscillator.

SUMMARY OF THE INVENTION

In accordance with the present invention, a method for performing burn-in of an IC without the use of a temperature controlled burn-in oven is disclosed. A further object of the invention is a method to detect high temperature failures by internally heating an IC. A practical circuit means for internally heating an IC is further provided. The practical circuit means uses primarily existing components of the IC.

An advantage of this invention is the ability to raise and control the temperature of an IC, so that it may be "burned-in" without using expensive dedicated hardware. A further advantage is the ability to raise and control the temperature of an IC, so that it may be tested at high temperature while it is embedded in a system.

The present invention is better understood in conjunction with the detailed description below and the accompanying drawings.

DETAILED DESCRIPTION OF THE INVENTION

This invention describes several related methods and apparatuses to heat and regulate the temperature of an integrated circuit, using controlled self-heating of the circuit, rather than the use of a temperature regulating chamber.

Figure 1:
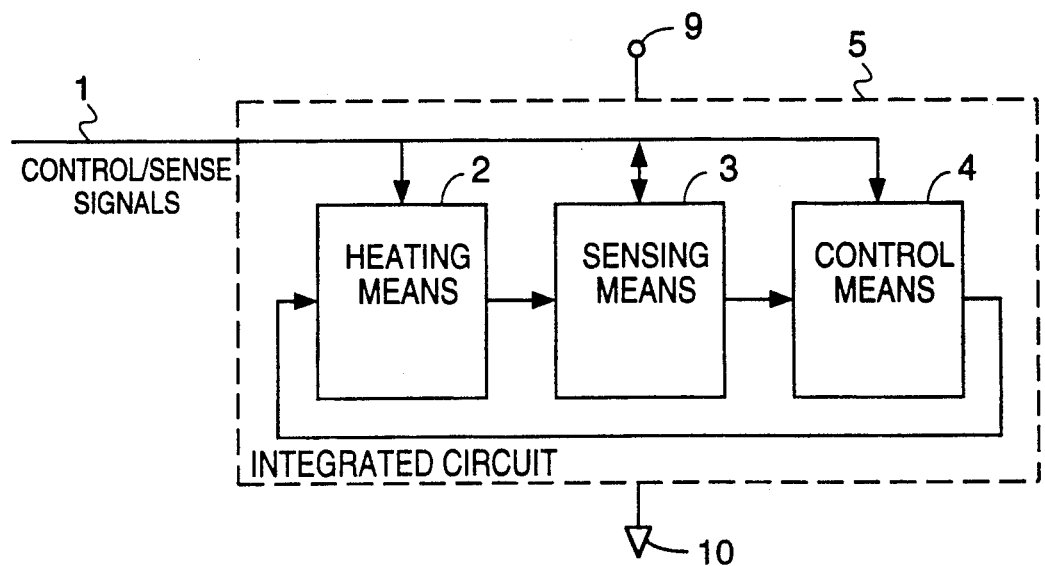
FIG. 1 shows a block diagram of the temperature heating and regulating system, in accordance with the present invention.

FIG. 1 is an overall block diagram of the invention. Control/sense signals 1 consist of one or more electrical signals used to activate the heating means 2 resident on the integrated circuit 5. The control/sense signals 1 may control the temperature of the circuit in an open-loop fashion simply by activating and deactivating the heating means 2 appropriately so as to raise the temperature a precalculated amount. If more accurate temperature regulation is required, sensing circuit means 3 may be added. Control/sense signals 1 may then carry a signal from the sensing circuit means 3 to an external control means (not shown) which would then activate heating means 2 to control the temperature more precisely. Alternately, an on-chip control circuit means 4 may be used in place of the external control means to regulate the temperature level, either under the control of the control/sense signals 1 or to its own prescribed level.

All methods to be described herein require generating heat on the integrated circuit by causing a current to flow from power supply 9 to ground 10 through the integrated circuit, so that heating is achieved as a function of the power consumed.

Figures 2A, 2B, 2C:
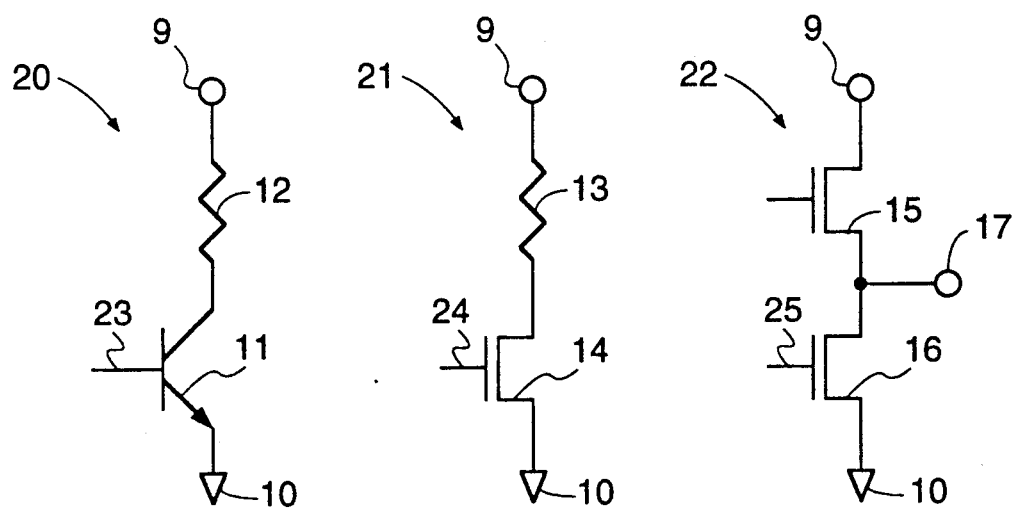
FIGS. 2A-2C shows three embodiments of heating circuit means, in accordance with the present invention.

FIG. 2A illustrates an embodiment 20 of the present invention for heating an integrated circuit. As bipolar transistor 11 is turned on by driving base terminal 23, current flows across resistor 12 and transistor 11 from the power supply 9 to ground 10, thereby generating heat. The current level, and thus the power consumed is controlled by the value of resistor 12. This embodiment 20 may be operated in an open loop fashion to increase the circuit temperature by a fixed amount. It may also be cycled on and off so as to further regulate the amount of heating.

FIG. 2B illustrates an embodiment 21 similar to the embodiment 20 shown in FIG. 2A, but having bipolar transistor 11 replaced by an MOS transistor 14.

FIG. 2C illustrates an embodiment 22 similar to embodiment 21 shown in FIG. 2B, except that resistor 13 is now replaced with MOS transistor 15.

In addition to regulating the heating by cycling the heating circuits on and off, it is possible to regulate the heating by turning the transistors partially on so as to thereby reduce the current.

The above embodiments of means for heating are intended to be illustrative and not limiting. Other embodiments of means for heating in the present invention may be implemented by other combinations of resistors, transistors or other components within the scope of the present invention. Also, the heating current may be supplied from the common on-chip power/ground buses, or may be supplied from other input/output pads of the integrated circuit. The circuit embodiments may be either dedicated circuitry or circuitry with shared functionalities.

Figure 3:
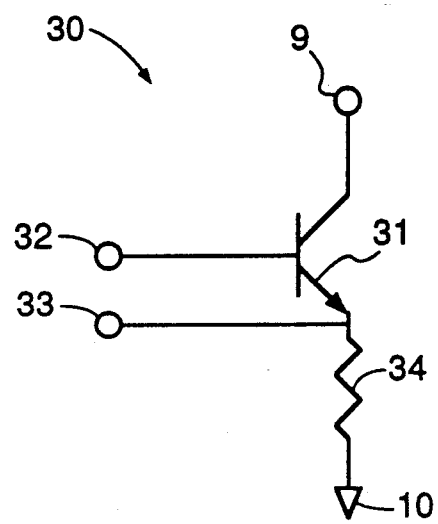
FIG. 3 shows a means 30 for sensing the temperature of an integrated circuit by monitoring the base-emitter voltage of a transistor.

There are many possible circuits and methods that can be used to determine the temperature of an integrated circuit. Some circuits make use of stable temperature dependent components internal to the IC. One circuit is illustrated in FIG. 3. In this example, the voltage across the base 32 and emitter 33 of transistor 31 is monitored as a known current flows through the transistor. Since the base-to-emitter voltage is proportional to the temperature of the transistor 31, the temperature of the transistor 31, which is presumed to have the temperature of the IC, may be determined. The current in this example is regulated by resistor 34.

More complex schemes are described by U.S. Pat. No. 4,768,170, entitled "MOS Temperature Sensing Circuit" by David L. Hoff, U.S. Pat. No. 4,497,998, entitled "Temperature Stabilized Stop-Restart Oscillator" by Burnell G. West, U.S. Pat. No. 4,165,642, entitled "Monolithic CMOS Digital Temperature Measurement Circuit," by Robert J. Lipp, and U.S. Pat. No. 4,593,208, entitled "CMOS Voltage and Current Reference Circuit" by Peter S. Single.

Figure 4:
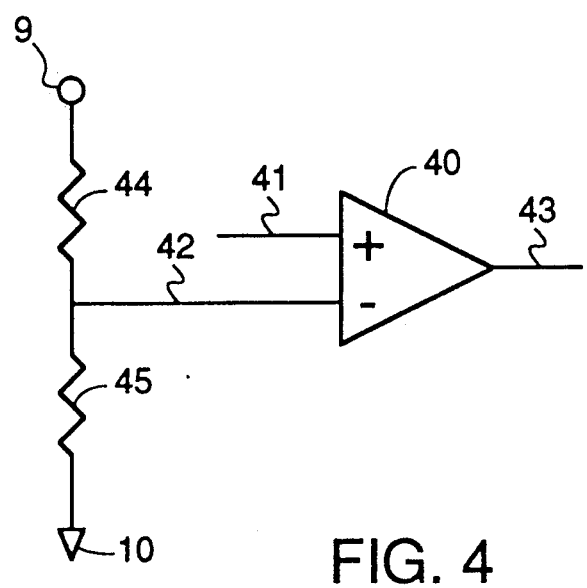
FIG. 4 shows a means 40 for controlling temperature by turning on and off a heating means using the base-emitter voltage of sensing means 30 shown in FIG. 3.

These and many other control means can also be used. Using FIG. 4 as an example, a comparator 40 may be attached with one input 41 connected to emitter 33 of the circuit shown in FIG. 3 and the other input 42 connected to a reference voltage signal. In this example, the reference voltage 42 is provided by the voltage divider formed by the resistors 44 and 45 between power 9 and ground 10. The output signal 43 of the comparator 40 can be used to turn the heating means on and off by, for example, driving any of the control inputs 23, 24 or 25 of FIG. 2, according to the temperature indicated by voltage of the emitter 33, so as to regulate the temperature.

Practical heating circuits which raise an IC to a high temperature are difficult to implement on an integrated circuit. Firstly, because of the power required, and therefore the current required, is quite large for the typically small components on the IC. As a result, the transistors and power distribution buses must be relatively large. In addition, power should be distributed evenly over the IC in order to provide even heating. The need for even heating implies that there should be more than one heating means on the IC, and since each of these heating means is relatively large, large areas on the IC may be needed.

A method to make a practical heating circuit is to use the existing output buffers on the IC as the heating circuits. In that case, the components of the IC's output buffers may be used to provide the transistors and resistors illustrated in FIG. 2. For example, the circuit in FIG. 2C may be found in an output buffer with terminal 17 as an output terminal. Normally, in an output buffer application, one of the transistors 15 and 16 would be off while the other is on. By turning the off transistor partially or completely on, power is consumed, thereby resulting in the heating of the IC. Since the output buffers typically encircle the interior of the IC, the IC would be evenly heated. Moreover, output buffers are typically large, and are usually connected to large power buses to provide the necessary current for heating operation. Because only a small amount of extra circuitry is required to operate them as a heating means in addition to their normal functions, the use of output buffers for heating requires little additional space on the IC.

Another method for integrating the heating components in a practical manner is to physically build them under the power/ground buses. The silicon area beneath the buses is often not well utilized because of the difficulty of interconnecting components built there. As the heating components must be directly connected to these buses, and these buses typically encircle the IC interior, this is an ideal location.

The methods described above are equally applicable to a hybrid circuit, which comprises a number of ICs assembled together in the same package, or to a wafer-scale integrated circuit where the complete circuit is formed by a number of interconnected IC still embedded in the original semiconductor wafer on which they were fabricated.

The methods and embodiments described herein are intended to be illustrative of the general principles of the present invention. The person of ordinary skill in the art will be able to provide numerous modifications and variations with the scope of the present invention as defined by the following claims, after consideration of the above description and accompanying drawings.

I claim:

1. An apparatus for quality, reliability or diagnostic testing in an integrated circuit die, comprising:
   means for receiving one or more control signals; and
   a plurality of means for heating said integrated circuit die in response to said one or more control signals, wherein said plurality of means for heating are embedded in said integrated circuit, said plurality of means for heating encircling the interior of said integrated circuit die, such that said integrated circuit die is heated substantially evenly.

2. An apparatus as in claim 1, further comprising means for sensing the temperature of said integrated circuit.

3. An apparatus as in claim 2, further comprising means for controlling said means for heating based on the temperature sensed by said means for sensing.

4. An apparatus as in claim 1, wherein said integrated circuit includes output buffers and said means for heating is formed by said output buffers.

* * * * *